(12) United States Patent
Gudesen

(10) Patent No.: US 6,724,028 B2
(45) Date of Patent: Apr. 20, 2004

(54) MATRIX-ADDRESSABLE ARRAY OF INTEGRATED TRANSISTOR/MEMORY STRUCTURES

(76) Inventor: Hans Gude Gudesen, Hans Petters vei 7, 1639 Gamle Fredrikstad (NO), 1639

( * ) Notice: Subject to any disclaimer, the term of this patent is extended or adjusted under 35 U.S.C. 154(b) by 0 days.

(21) Appl. No.: 10/300,802

(22) Filed: Nov. 21, 2002

(65) Prior Publication Data

US 2003/0107067 A1 Jun. 12, 2003

Related U.S. Application Data

(60) Provisional application No. 60/338,663, filed on Dec. 11, 2001.

(30) Foreign Application Priority Data

Dec. 10, 2001 (NO) .......................................... 20016041

(51) Int. Cl.[7] ............................................. H01L 31/062
(52) U.S. Cl. ........................................................ 257/295
(58) Field of Search ............................................ 257/295

(56) References Cited

U.S. PATENT DOCUMENTS

| 6,146,955 A | 11/2000 | Lee ............................. 438/305 |
| 6,285,577 B1 * | 9/2001 | Nakamura ................... 365/145 |
| 2003/0134502 A1 * | 7/2003 | Gudesen ..................... 438/631 |

FOREIGN PATENT DOCUMENTS

| EP | 0 304 896 | 1/1989 |
| GB | 2 230 899 | 10/1990 |
| WO | PCT/NO02/00397 | 11/2002 |
| WO | PCT/NO02/00414 | 11/2002 |

* cited by examiner

Primary Examiner—David Nelms
Assistant Examiner—Tu-Tu Ho
(74) Attorney, Agent, or Firm—Jacobson Holman PLLC

(57) ABSTRACT

In an array of integrated transistor/memory structures the array includes one or more layers of semiconducting material, two or more electrode layers, and memory material contacting electrodes in the latter. At least one layer of a semiconducting material and two electrode layers form transistor structures such that the electrodes of the first electrode layer forms source/drain electrode pairs and those of a second electrode layer form the gate electrodes thereof. The source and drain electrodes of a single transistor/memory structure are separated by a narrow recess extending down to the semiconducting layer wherein the transistor channel is provided beneath the recess and with extremely small width, while the source and drain regions are provided beneath the respective source and drain electrodes on either side of the transistor channel. Memory material is provided in the recess and contacts the electrodes of the transistor.

14 Claims, 4 Drawing Sheets

MATRIX-ADDRESSABLE ARRAY OF INTEGRATED TRANSISTOR/MEMORY STRUCTURES

This is a complete application claiming benefit of provisional No. 60/338,663 filed Dec. 11, 2001 and of Norway Application 20016041 filed Dec. 10, 2001.

FIELD OF THE INVENTION

The present invention concerns a matrix-addressable array of integrated transistor/memory structures, wherein the array comprises one or more layers of semiconducting material, two or more electrode layers, as well as memory material contacting electrodes in said at least two electrode layers, wherein the memory material is a polarizable dielectric material capable of exhibiting hysteresis, particularly a ferroelectric or electret material, wherein the electrodes in said at least two electrode layers in each layer are provided as continuous or interrupted parallel extended structures, wherein said at least one layer of a semiconducting material and said at least two electrode layers form field-effect transistor structures, wherein the electrodes of a first electrode layer form the source/drain electrode pairs of said field-effect transistor structures, wherein the electrodes of an adjacent second electrode layer forms the gate electrode of the field-effect transistor structures, the gate electrodes in any case are provided in a substantial orthogonal orientation relative to the electrodes of the first electrode layer.

BACKGROUND OF THE INVENTION

A major problem in modern computing is the physical split between storage devices and processing units, more specifically between CPUs and operating software, user software and user data. Recent improvements in effective Cpu speeds (e.g. the development from Pentium II onwards) has been enabled by integrating increasingly more memory capacity inside the CPU (SRAM/EEPROM), however, the overall speed is still seriously hampered by the fact that most software and data still uses the hard disk as primary storage medium. Although the transfer rate of hard disks has improved in recent years, as have the capacity of buses, the maximum speed potential is still controlled by the very slow access speed of the hard disks, a speed which barely has improved in the last 10–15 years, and which will not improve substantially either as long as this primary storage medium remains a mechanically operated device.

If the bulk of data now using the hard disk could utilize memory capacity inside the CPU itself, not just would the speed gains become extreme, even more important could be the fact that entirely novel types of processing and computing devices could be envisaged, opening up for new approaches to (parallized) software, much more adapted to solving complex problems (e.g. non-indexed searches, continuous speech recognition, artificial intelligence, etc.).

The increasing incompatibility between storage devices and processing units deriving from the physical split therebetween not only leads to severe capacity problems, but is also causing latency and inefficient exploitation of high-speed processing circuitry.

SUMMARY OF THE INVENTION

Hence, a major object of the present invention is to obviate or eliminate the above problems by introducing a novel architecture allowing the integration of non-volatile memory and high-speed transistor circuitry which can be applied to inorganic as well as organic electronics or hybrids thereof, and which moreover is not limited to planar devices, but equally well applicable to volumetric devices.

The above object as well as further advantages and features are realized with the matrix-addressable array according to the present invention, which is characterized in that the source and drain electrodes of a single transistor/memory structure are separated by a narrow vertical recess extending therebetween and down to the semiconducting layer, that the transistor channel is provided in the semiconducting layer beneath the recess between the source and drain electrodes, that the source and drain regions of the transistor structures are provided beneath the source and drain electrodes at either side of the transistor channel, that the memory material is provided filling the recess between the source and drain electrodes and covering the top surfaces thereof, that a gate electrode is provided contacting the memory material whereby the transistor channel is defined with a length L corresponding to the width of the recess and a width W corresponding to the width of the gate electrode, L being a fraction of W, and that three memory cells are defined in the memory material respectively between the source electrode and the gate electrode, between the drain electrode and the gate electrode and in the recess between the source and drain electrodes.

In an advantageous embodiment of the matrix-addressable array according to the present invention the transistor/memory structure comprises a third electrode layer of semiconducting material opposite the source and drain electrode layer, said third electrode layer comprising a second gate electrode extending in the same direction as the first gate electrode and registering therewith, whereby the transistor/memory structure is realized as a dual gate field-effect transistor.

According to the invention the first memory cell contacts the source and the gate electrodes, the second memory cell contacts the drain and the gate electrodes, and the third memory cell contacts the source and the drain electrodes. In the latter case the memory material in the third memory cell preferably has a thickness different from that of the first and second memory cells, and in that case the memory material preferably is a ferroelectric or electret organic material, preferably a polymer or copolymer.

In the matrix-addressable array according to the invention the semiconducting material advantageously is an inorganic semiconducting material, preferably amorphous silicon, polycrystalline silicon or microcrystalline silicon; or the semiconducting material is advantageously an organic semiconducting material, preferably a semiconducting polymer or pentacene.

In a second advantageous embodiment of the matrix-addressable array according to the invention an additional transistor memory is provided in registration with the first single transistor/memory structure opposite the gate electrode thereof and inverted in relation to the first single transistor memory structure, said additional transistor/memory structure sharing the same gate electrode with the latter, thus realizing a dual transistor/memory structure with common gate and six memory cells, and then the dual transistor/memory structure preferably realizes a common gate complementary field-effect transistor. In a variant of this second embodiment the dual transistor memory structure advantageously is provided with at least one additional gate electrode, said at least one additional gate electrode being provided on one of the layers of semiconducting material opposite the source/drain electrode layer.

In a third advantageous embodiment of the matrix-addressable area according to the invention, the matrix-addressable array is realized as a three-dimensional array by stacking two or more two-dimensional arrays of transistor/memory structures, and that a two-dimensional array is isolated from an adjacent neighbouring two-dimensional array by a separation layer, and then the separation layer preferably is selected as one of the following, viz. a layer of insulating material, a layer of conducting or semiconducting material coated to form an insulating barrier, or a layer of conducting or semiconducting material surface-oxidized to form the insulating barrier.

BRIEF DESCRIPTION OF THE DRAWINGS

The invention shall now be explained in more detail with reference to its prerequisite technological background as well as a discussion of preferred embodiments thereof and with reference to the accompanying drawing figures, in which.

DETAILED DESCRIPTION OF THE PREFERRED EMBODIMENTS

Figure 1A:
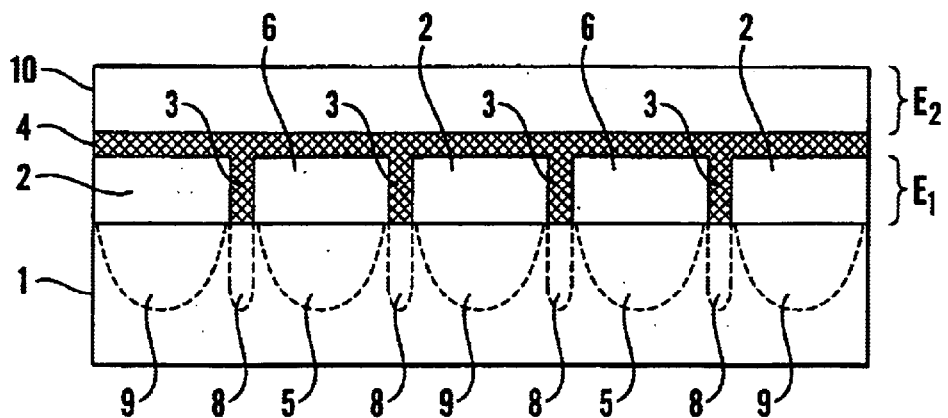
FIG. 1a shows a cross section of a prior art array of field-effect transistor structures wherein the electrodes are provided in dense arrangement, FIG. 1b a plan view of the array in FIG. 1a, FIG. 2a a cross section of a single integrated transistor/memory structure as provided in the present invention, FIG. 2b a plan view of the transistor/memory structure in FIG. 2a, FIG. 2c a perspective view of the geometrical layout of memory material in the transistor/memory structure in FIG. 2a, FIG. 3a a first preferred embodiment of a dual transistor/memory structure according to the invention, FIG. 3b a variant of the embodiment of FIG. 3a, FIG. 3c a second embodiment of a dual transistor/memory structure according to the invention, FIG. 3d a third embodiment of a dual transistor memory structure according to the invention, and FIG. 4 a three-dimensional matrix-addressable array according to the invention.
Figure 1B:
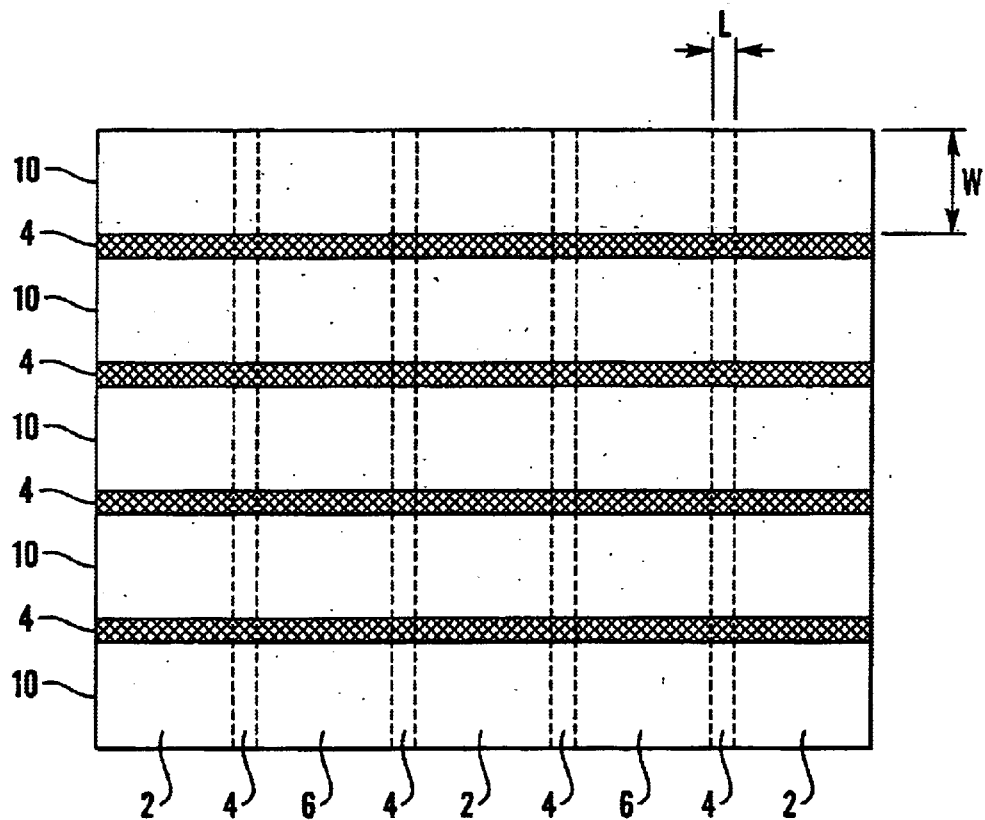

The general background of the present invention shall now be briefly discussed. At its very foundation lays the concept of a dense electrode arrangement which has been disclosed in a co-pending international patent application No. PCT/N002/00414 belonging to the same applicant. A dense electrode arrangement as described therein corresponds to the electrode arrangements shown in cross section in FIG. 1a and plan view in FIG. 1b, in which the arrangement of the electrodes in the electrode layers E1 and E2 is shown as indicated in FIG. 1a. Instead of being restricted by a pitch deriving from constraints imposed by design rules of conventional patterning technology, e.g. photomicrolithography, separate patterning and molding processes are used to form electrode sets E1;E2 with e.g. in each case parallel strip-like electrodes separated by an arbitrarily small distance and mutually electrically insulated by an insulating material 4 provided in recesses 3 between e.g. electrodes 2,6 of the electrode set E1. Crosswise oriented electrodes 10 of the electrode layer E2 can be similarly laid out and mutually insulated in a corresponding manner by an insulating material or barrier 4 as seen to advantage in the plan view in FIG. 1b. Since the separation between the electrodes 2;6 indicated by the distance L in FIG. 1b is not subject to any design rules, and in principle can be of equal magnitude to the thickness of a layer 4 deposited by methods which in theory would allow a magnitude of L down to monoatomic size, the dense electrode arrangement as disclosed in the above-mentioned international patent application allows the realization of dense matrices of cells of functional material provided say between electrode sets such as E1 and E2 and addressable thereby.

Moreover, the present invention also has its basis in a co-pending international patent application No. PCT/N002/00397 belonging to the same applicant and which describes transistor matrices consisting of field-effect transistor structures with ultrashort channel length L and arbitrarily large channel width W, thus offering possibilities in field-effect transistor designs hitherto undreamt of. Hence FIG. 1a can be taken to render a cross section of transistor structures arranged in a matrix, as readily can be seen from the plan view in FIG. 1b. In FIG. 1a a source electrode 2 is formed in the first electrode layer E1 running parallel to drain electrode 6 of about similar dimensions. Source and drain electrodes 2;6 are provided on a semiconducting substrate 1 e.g. of silicon which by means of method and processes described in the above-mentioned international patent application has been doped to form source regions 9 and drain regions 5 in the silicon substrate, which additionally has been doped beneath the recesses 3 formed between the source and drain electrodes 2;6 to form a transistor channel 8 of ultrashort length L. The source and drain electrodes 2;6 are as before isolated by barrier material 4 filling the recesses 3 therebetween and covering the top surfaces thereof, thus providing an insulating layer 4. The crosswise oriented gate electrodes 10 of the field-effect transistor structures are provided as seen to advantage in the plan view in FIG. 1b. The channel length L of the transistor channel 8 can be made almost arbitrarily small, conforming to the thickness of a layer 4 which by methods well-known to persons skilled in the art can be deposited with a thickness down to almost monoatomic size. On the other hand the channel width W will be given by the width of the gate electrodes 10 and hence the ratio W/L can be made very large, thus giving a very high drain current $I_D$ as desirable. Present-day technology for patterning in the region well beyond the 0.1 μm range will hence allow transistor matrices as shown in e.g. FIG. 1b and with transistor structures realized in a corresponding small scale.

Figure 2A:
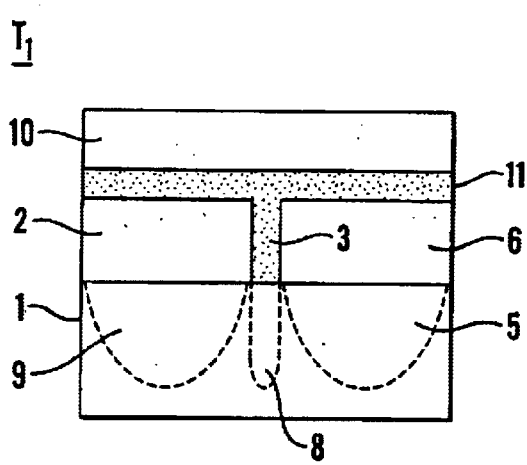
Figure 2B:
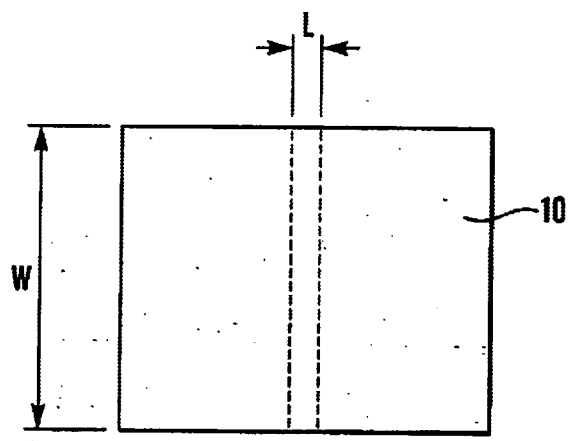

The basic technology as disclosed in the two above-mentioned international patent applications now forms point of departure for realizing a matrix-addressable array of integrated transistor/memory structures according to the present invention. A single transistor/memory structure $T_1$ according to the present invention is shown in FIG. 2a and appears structurally similar to corresponding structures in e.g. FIG. 1a. As before, a source electrode 2 and a drain electrode 6 are provided on a substrate or layer 1 of semiconducting material which has suitably been doped to form a source region 9, an ultrashort transistor channel 8 and a drain region 5 in the semiconducting substrate. Now, instead of providing a barrier of insulating material 4 as shown in FIG. 1a, this material is replaced by a memory material in the form of a thin layer 11 of a polarizable dielectric material capable of exhibiting hysteresis, particularly a ferroelectric or electret material. Preferably the ferroelectric memory material as known to persons skilled in the art can then be a ferroelectric polymer or copolymer and then in the latter case most preferably a polyvinylidene fluoride/tri-fluoroethylene copolymer (PVDF-TrFE) which can be deposited in extremely thin layers, e.g. down to a nanometer scale, and which of course, being a ferroelectric material, also can provide the necessary insulating properties. The memory material 11 is provided as shown in FIG. 2a, filling the recess 3 between the source and drain electrodes 2;6 and covering the top surfaces thereof, providing insulationor a barrier against the gate electrode 10. The transistor/memory structure $T_1$ is thus now also combined with the memory material 11 to form three separate memory cells which can be seen better in FIG. 2c, which in perspective shows a layer of memory material 11 with all other features removed. This memory material 11 now has three distinct portions, viz. first portion 11a forming a first memory cell which can be addressed via the gate electrode 10 and the source electrode 2, a second portion 11b forming a second memory cell which can be addressed via the gate electrode 10 and the drain electrode 6, and a third portion 11c forming a third memory cell in the recess 3 between the source and drain electrodes 2;6 and addressable thereby. These three memory cells 11a, 11b, 11c can be addressed, i.e. read and written independently of the operation of the field-effect transistor proper. In this connection it should be understood that three memory cells can store a three bit word, i.e. for instance any of the binary words 000, 001, 010, 011, 100, 101 and 111. Write/read of such three bit binary words will of course be a matter of protocol, as is well-known to persons skilled in the art, and shall not be further discussed herein. The whole operation of the device shall be explained more fully in the following section.

Figure 2C:
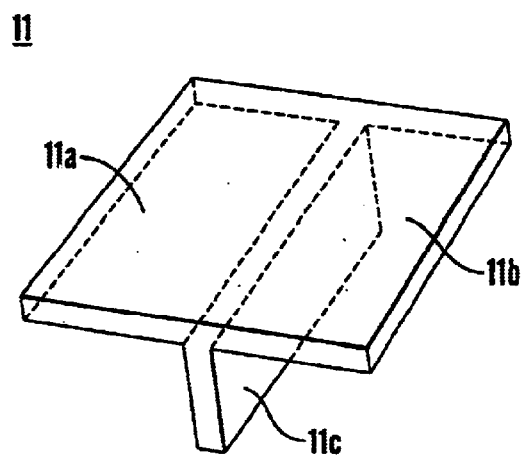

The memory material 11 forming the three memory cells 11a, 11b, 11c as shown in FIG. 2c, allows multidirectional switching as shall now be explained. The first cell 11a corresponds to the portion of memory material 11 between the source electrode 2 and the gate electrode 10 and will be switched in a direction orthogonal to the surfaces of these electrodes and the memory cell 11a by applying a voltage to the source electrode 2 and the gate electrode 10, creating a potential therebetween and an electric field across the memory cell 11a, which now as an e.g. ferroelectric memory material can be polarizedin either the up or down direction and thus allowing the storage of a binary digit. The same consideration applies to the memory cell 11b in the portion of the memory material 11 between the drain electrode 6 and the gate electrode 10. In addition a third memory cell 11c is provided by the memory material 11 in the recess 3 between the source electrode 2 and the drain electrode 6 and will be similarly switched by applying voltage between these, setting up an electric field across the memory cell 11c therebetween. In a typical preferred ferroelectric material such as polyvinylidene trifluoride-trifluoroethylefle (PVDF-TrFE), a certain field strength will be necessary in order to polarize the material and switch between the two polarization states representing either a binary 0 or binary 1. The field strength required is in other words related to the thickness of the thin-film memory material 11, and the thickness thereof in the memory cells 11a and 11b can be different from that in the memory cell 11c. For practical purposes the memory cell 11a can now be denoted source/gate memory cell (S/G memory cell) and similarly memory cell 11b the drain/gate memory cell (D/G memory cell), while then of course memory cell 11c can be denoted the source/drain memory cell (S/D memory cell). As the S/G and D/G memory cell material 11 have the same thickness, these two cells will be switched by the same applied field strength, while the memory material in the S/D memory cell can be thicker or thinner than in the two former memory cells, and hence shall allow switching at a different field strength between the source and drain electrodes 2;6. Now the transistor structure formed by the source and drain electrodes 2;6 the doped regions 5,8,9 and the gate electrodes 10 shall allow the transistor switching independently of the memory switching and this implies that the transistor shall be switched by allowing a lower source or drain voltage than that required to switch the S/D memory cell and a gate electrode voltage much lower than that required for switching either the S/G memory cell or the D/G memory cell. In practice, the switching of these latter two memory cells will be completely independent of the transistor switching.

Now various preferred structural embodiments of the transistor/memory structures according to the invention shall be discussed.

Figure 3A:
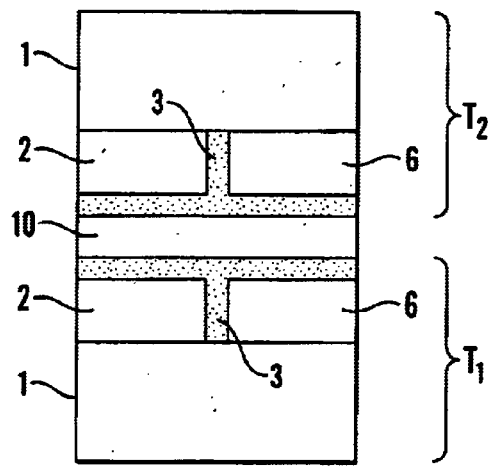
Figure 3B:
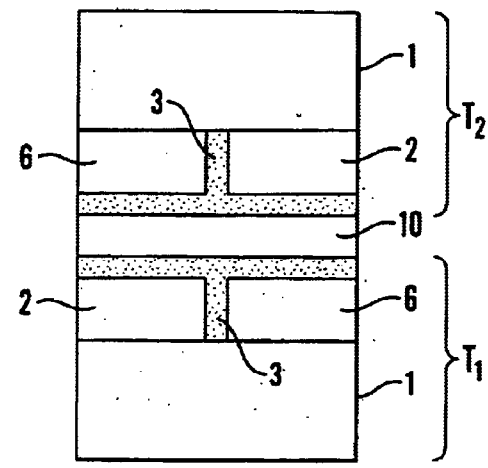

FIG. 3a shows a first preferred embodiment wherein a second transistor/memory structure is provided above a first single transistor/memory structure $T_1$. The two transistor/memory structures $T_1$, $T_2$ shares the same gate electrode 10, while the electrode layers comprising the source/drain electrodes 2;6 are provided inverted respective to each other on opposite sides of the common gate electrode 10. The doped regions of the transistors are as before found in the semiconducting substrate 1 provided on either side in each of the transistor/memory structures $T_1$;$T_2$ as shown. These combined structures actually are a common gate transistor structure and could appropriately connected be used to realize a common gate complementary transistor circuit where $T_1$ forms the first transistor of the circuit and $T_2$ the second transistor of the circuit. It is, of course, then to be understood that the substrates 1 must be doped accordingly to form respectively a npn or a pnp channel structure. A similar dual transistor/memory structure is shown in FIG. 3b, but now with the positions of the source and drain electrodes 2;6 reversed in their respective transistor/memory structures $T_1$;$T_2$. As will be seen the dual transistor/memory structures in FIGS. 3a and 3b are realized with six memory cells that can be separately addressed. It will also be evident that the structures depicted in FIGS. 3a and 3b shall allow six independently switchable memory cells and thus the possibility of storing a six bit binary word and writing and reading the same with any suitable protocol as obvious to persons skilled in the art.

Figure 3C:
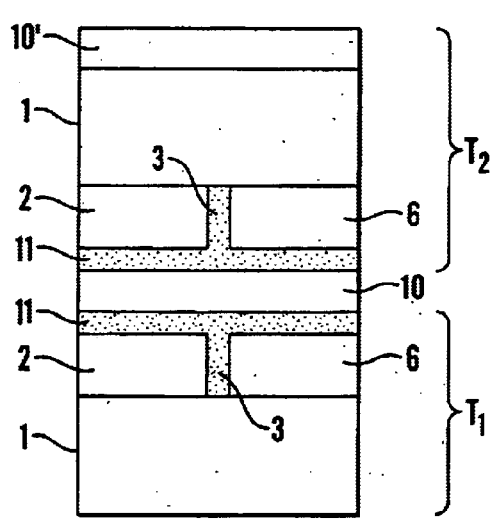

A second embodiment of the dual transistor/memory structure is shown in FIG. 3c, wherein the second transistor/memory structure $T_2$ is provided with a second gate electrode 10, thus making $T_2$ a dual gate transistor/memory structure.

Figure 3D:
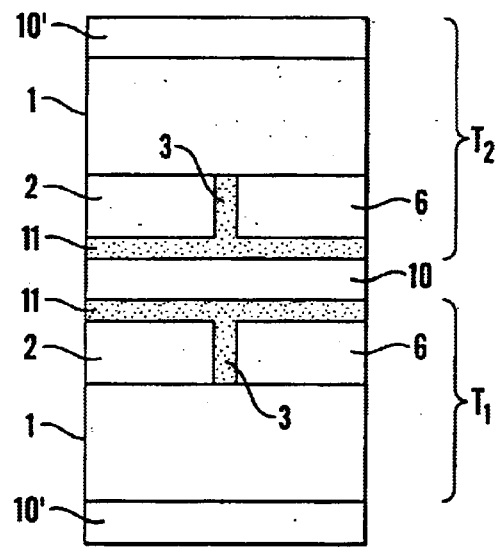

A third embodiment of dual transistor/memory structure is shown in FIG. 3d and is similar to the embodiment in FIG. 3c, but now also with a second gate electrode 10' added to the transistor/memory structure $T_1$, thus making both structures $T_1$;$T_2$ dual gate transistor/memory structures with gate electrodes 10, 10'.

The substrate, i.e. the layer of semiconducting material 1 can preferably be made of silicon; in case either amorphous, polycrystalline or microcrystalline silicon. Another advantage of an inorganic semiconductor material such as silicon is of course the possibility of forming a barrier layer thereupon by performing a surface oxidation thereof. But there is nothing to prevent the layer of semiconductor material being an organic semiconductor, e.g. a semiconducting polymer or a cyclic compound such as pentacene, as well-known to persons skilled in the art. Laying down the electrodes of the electrode layer E1 on an organic semiconducting material, one must then take precautions to heed the compatibility between the electrodes materials and any organic semiconducting material with regard to process temperature regime and so on.

The memory material 11 shall be a dielectric and polarizable material with ferroelectric or electret properties that is capable of showing hysteresis when subjected to an electrical field. Most preferably such materials will be organic as mentioned, polymers or copolymers and even more preferably PVDF-TrFE will be used as memory material. An added advantage of such memory materials is that their dielectric properties allow their function as electrically insulating barrier materials as well, and further advantage is the possibility of applying them in global layers of extreme thinness down to a few nanometers and finally that they can easily be applied on complex surface geometries to form memory cells, including complete filling of the recesses 3 such as formed between the source and drain electrodes 2;6.

Figure 4:
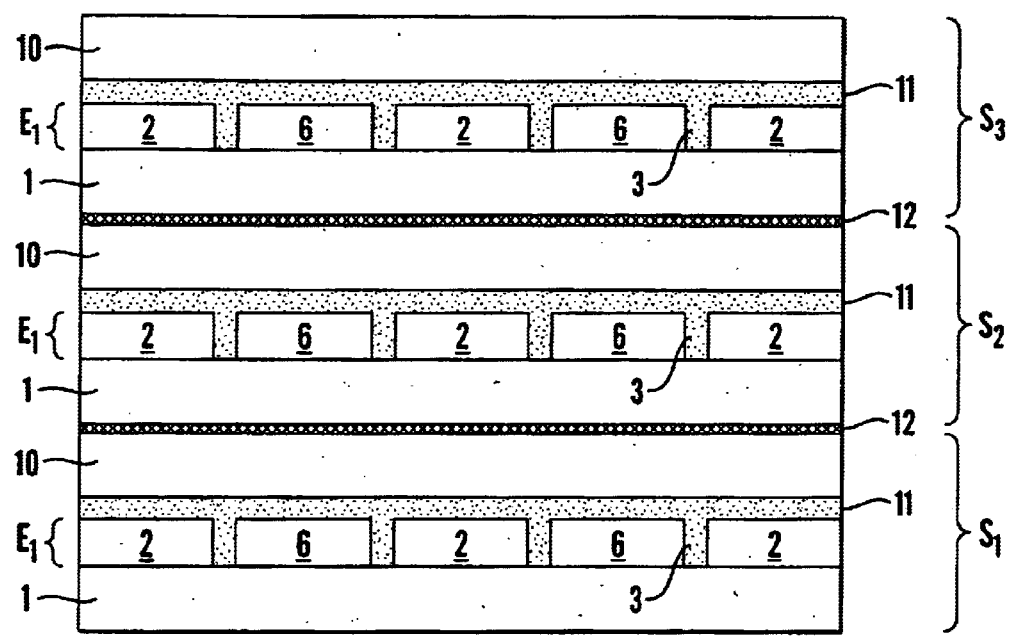

In the preceding sections the matrix-addressable array of transistor/memory structures have been more or less treated as a kind of two-dimensional array, but it is also possible to stack such two-dimensional arrays to form three-dimensional arrays, as shown in FIG. 4, which renders a three-dimensional matrix-addressable array according to the invention and formed by three stacked two-dimensional arrays $S_1, S_2, S_3$. The point of departure here is of course, the single transistor/memory structure in FIG. 1a, but a three-dimensional matrix-addressable arrays of such transistor memory structures need not be limited to that particular one, but could rely on the dual structures for instance shown in FIGS. 3a–3d, and other combinations of electrode layers and layers of semiconducting material will be possible with the only constraint that separate switching of respectively the transistor structure proper and the memory cells must also be possible. As will be seen, the three-dimensional matrix-addressable array shown in FIG. 4 with three stacks $S_1$ of two-dimensional arrays formed with a single layer 1 of semiconducting material, a first electrode layer E1 comprising the source and drain electrodes 2;6 separated by the recesses 3 as before and the latter filled with memory material 11, which also covers the top surfaces of the electrodes 2;6. Now follows the gate electrode 10 which may be separated from the adjacent neighbouring stack by a separation layer 12. This separation layer could be a separate material and for the sake of that consist of a dielectric memory material 11, but could also be a barrier coating with insulating properties applied to the gate electrodes 10. As the gate electrodes 10 in a stacked two-dimensional array S is followed by the layer of semiconducting material 1 in the adjacent neighbouring two-dimensional matrix-addressable array this layer of semiconducting material could be treated to form a barrier layer at its surface adjacent to the gate electrode, e.g. by ensuring that a surface of an inorganic semiconducting material used in layer 1 e.g. is oxidized before it is located upon the underlying stack. This is of course easy to achieve when the inorganic semiconducting material is silicon, by simply performing a surface oxidation thereof.

In principle there will be no limitation as to the number of stacked layers S that can be used to form a three-dimensional matrix-addressable array, but there will of course be certain practical limits imposed, say by mechanical or thermal constraints and the requirement to avoid an increased bumpiness in the stacked structure as the number of stacked layers increases. However, these are well-understood technical problems and can partly be obviated by taking necessary precautions as known to persons skilled in the art.

It will be seen that the present invention provides a matrix-addressable array of integrated transistor/memory structure in two or three dimensions with the integration of memory cells with transistor switches and allowing the switching of either to take place in separate voltage regimes, without a switching of e.g. a memory cell affecting the transistor integrated therewith. Information to be processed or for device operation can be stored in memory cells integrated in the transistor circuitry and hence eliminate the need for external access and peripheral storage devices.

Moreover, it will be obvious that in any two-dimensional array it will be possible to separate groups of transistor/memory structures and form circuit arrangements thereof as desired, e.g. by removing these transistor memory structures in certain portions of the two-dimensional array and then providing appropriate vias and interconnects with necessary insulation and barrier layers as required to form, say logic cells and arithmetic registers with integrated memory in a combined processor/memory circuit which moreover also can be realized in three dimensions allowing a higher degree of connectivity. This opens for completely new perspectives for creating integrated processor/memory structures of high complexity and in dense arrangements allowing high speed and extremely fast memory access with the necessary registers provided internally and without the circuitry being subject to the usual topological constraints inherent in much of present day integrated circuit technology being based on say silicon.

What is claimed is:

1. A matrix-addressable array of integrated transistor/memory structures, the array comprising one or more layers of semiconducting material, two or more electrode layers as well as memory material contacting electrodes in said two or more electrode layers, the memory material being a polarizable dielectric material capable of exhibiting hysteresis, particularly a ferroelectric or electret material, the electrodes in said at least two electrode layers in each layer being provided as continuous or interrupted parallel extended structures, said at least one layer of a semiconducting material and said at least two electrode layers forming field-effect transistor structures, the electrodes of a first electrode layer forming the source/drain electrode pairs of said field-effect transistor structures, the electrodes of an adjacent second electrode layer forming the gate electrodes of the field-effect transistor structures, the gate electrodes in any case provided in a substantial orthogonal orientation relative to the electrodes of the first electrode layer, the source and drain electrodes of a single transistor/memory structure being separated by a narrow vertical recess extending therebetween and down to the semiconducting layer, a transistor channel being provided in the semiconducting layer beneath the recess between the source and drain electrodes, the source and drain regions of the transistor structures being provided beneath the source and drain electrodes at either side of the transistor channel the memory material being provided filling the recess between the source and drain electrodes and covering the top surfaces thereof, a gate electrode being provided contacting the memory material whereby the transistor channel being defined with a length L corresponding to the width of the recess and a width W corresponding to the width of the gate electrode, L being a fraction of W, and three memory cells being defined in the memory material respectively between the source electrode and the gate electrode, between the drain electrode and the gate electrode and in the recess between the source and drain electrodes.

2. The matrix-addressable array according to claim 1, wherein a transistor/memory structure comprises a third electrode layer of semiconducting material opposite the source and drain electrode layer, said third electrode layer comprising a second gate electrode extending in the same direction as the first gate electrode and registering therewith, whereby the transistor/memory structure is realized as a dual gate field-effect transistor.

3. The matrix-addressable array according to claim 1, wherein the first memory cell contacts the source and the gate electrodes.

4. The matrix-addressable array according to claim 1, wherein the second memory cell contacts the drain and the gate electrodes.

5. The matrix-addressable array according to claim 1, wherein the third memory cell contacts the source and the drain electrodes.

6. The matrix-addressable array according to claim 5, wherein the memory material in the third memory cell has a thickness different from that of the first and second memory cells.

7. The matrix-addressable array according to claim 5, wherein the memory material is a ferroelectric or electret organic material of a polymer or copolymer.

8. The matrix-addressable array according to claim 1, wherein the semiconducting material is an inorganic semiconducting material of amorphous silicon, polycrystalline silicon or microcrystalline silicon.

9. The matrix-addressable array according to claim 1, wherein the semiconducting material is an organic semiconducting material of a semiconducting polymer or pentacene.

10. A matrix-addressable array according to claim 1, wherein an additional transistor/memory structure is provided in registration with the first single transistor/memory structure opposite the gate electrode thereof and inverted in relation to the first single transistor memory structure, said additional transistor/memory structure sharing the same gate electrode with the latter, thus realizing a dual transistor/memory structure with common gate and six memory cells.

11. The matrix-addressable array according to claim 10, wherein the dual transistor/memory structure realizes a common gate complementary fieldeffect transistor.

12. The matrix-addressable array according to claim 10, wherein the dual transistor/memory structure is provided with at least one additional gate electrode, said at least one additional gate electrode being provided on one of the layers of semiconducting material opposite the source/drain electrode layer.

13. The matrix-addressable array according to claim 1, wherein the matrix-addressable array is realized as a three dimensional array by stacking two or more two dimensional arrays of transistor/memory structures, and a two dimensional array is isolated from an adjacent neighbouring two dimensional array by a separation layer.

14. The matrix-addressable array according to claim 13, wherein the separation layer is selected as one of the following: a layer of insulating material, a layer of conducting or semiconducting material coated to form an insulating barrier, or a layer of conducting or semiconducting material surfaceoxidized to form the insulating barrier.

* * * * *